(12) United States Patent
Lee

(10) Patent No.: US 7,679,122 B2
(45) Date of Patent: Mar. 16, 2010

(54) SEMICONDUCTOR DEVICE INCLUDING SOURCE STRAPPING LINE

(75) Inventor: Wook-Hyoung Lee, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 551 days.

(21) Appl. No.: 11/520,817

(22) Filed: Sep. 14, 2006

(65) Prior Publication Data

US 2007/0096187 A1    May 3, 2007

(30) Foreign Application Priority Data

Sep. 16, 2005    (KR) .................... 10-2005-0086616

(51) Int. Cl.
*H01L 29/94*    (2006.01)
(52) U.S. Cl. .................... 257/304; 257/258; 257/658; 257/909; 257/59; 257/E25.002
(58) Field of Classification Search .................... 257/258, 257/658, 909–911, 918, 5, 59, 72, 88–97, 257/202–211, 291–294, 390–391, 443–448, 257/E27.026–E27.027, E27.046–E27.11, 257/E27.121, E27.124–E27.126, E27.133–E27.14, 257/E25.002–E25.028
See application file for complete search history.

(56) References Cited

U.S. PATENT DOCUMENTS

| | | | | |
|---|---|---|---|---|
| 6,160,297 | A * | 12/2000 | Shimizu et al. | 257/390 |
| 6,376,876 | B1 * | 4/2002 | Shin et al. | 257/315 |
| 6,384,449 | B2 * | 5/2002 | Lee et al. | 257/315 |
| 6,770,533 | B2 * | 8/2004 | Hisamune et al. | 438/258 |
| 6,819,592 | B2 * | 11/2004 | Noguchi et al. | 365/185.17 |
| 6,903,406 | B2 * | 6/2005 | Lee et al. | 257/315 |
| 6,925,008 | B2 * | 8/2005 | Ichige et al. | 365/185.17 |
| 7,005,696 | B2 * | 2/2006 | Yih et al. | 257/314 |
| 7,425,739 | B2 * | 9/2008 | Watanabe et al. | 257/296 |
| 2002/0064916 | A1 * | 5/2002 | Nagai et al. | 438/257 |
| 2006/0256246 | A1 * | 11/2006 | Wu et al. | 349/38 |

FOREIGN PATENT DOCUMENTS

| | | |
|---|---|---|
| JP | 06349917 A | 12/1994 |
| JP | 11-204763 | 7/1999 |
| JP | 11-307746 | 11/1999 |
| JP | 11325882 A | 11/1999 |
| JP | 2000009553 A | 1/2000 |

(Continued)

*Primary Examiner*—N Drew Richards
*Assistant Examiner*—Swapneel Chhaya
(74) *Attorney, Agent, or Firm*—Volentine & Whitt, PLLC

(57) ABSTRACT

A semiconductor device includes a plurality of source regions and drain regions disposed on a semiconductor substrate. The semiconductor device also includes a plurality of word lines disposed on the semiconductor substrate between the source regions and the drain regions. The semiconductor device also includes a conductive line disposed on the semiconductor substrate parallel to the word lines. The semiconductor device also includes a plurality of bit lines connected to the drain regions and crossing over the word lines. The semiconductor device also includes a plurality of source strapping lines crossing over the plurality of word lines, the plurality of source strapping lines being connected to at least one of the plurality of source regions and the conductive line. The semiconductor device also includes a ground line connected to the conductive line.

16 Claims, 10 Drawing Sheets

FOREIGN PATENT DOCUMENTS

| | | |
|---|---|---|
| JP | 2001-196482 | 7/2001 |
| JP | 2005-223338 | 8/2005 |
| KR | 1020010060549 A | 7/2001 |
| KR | 1020010092087 A | 10/2001 |
| KR | 1020040107950 A | 12/2004 |
| KR | 1020050017485 A | 2/2005 |
| KR | 1020050021616 A | 3/2005 |
| KR | 1020050080321 A | 8/2005 |

* cited by examiner

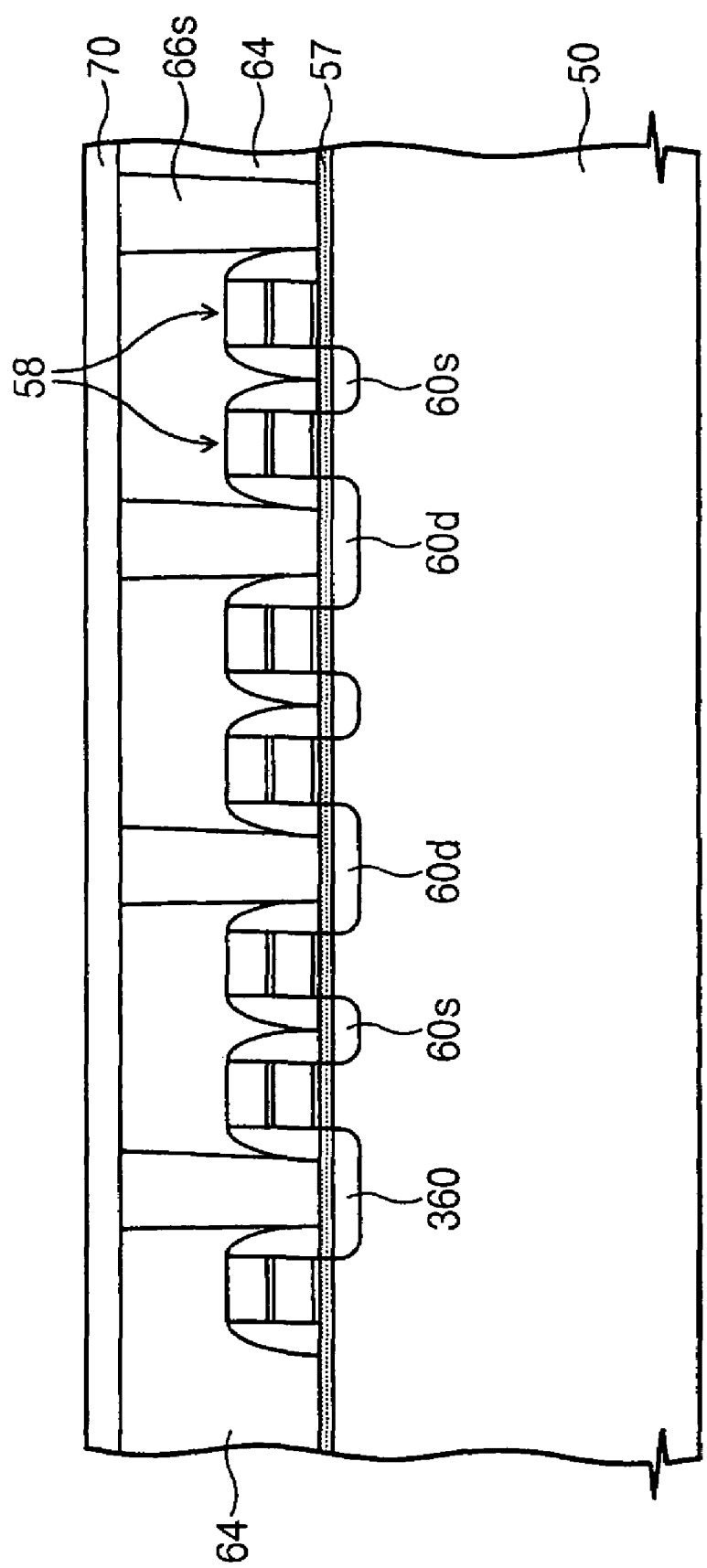

SEMICONDUCTOR DEVICE INCLUDING SOURCE STRAPPING LINE

BACKGROUND OF THE INVENTION

1. Field of the Invention

The present invention relates to a semiconductor device and, more particularly, to a semiconductor device including a source strapping line that electrically connects a plurality of cell sources for a signal input.

2. Description of the Related Art

A semiconductor memory device generally includes a plurality of transistors with source regions and drain regions. Additionally, the semiconductor memory device includes a source strapping line that connects the source regions of the plurality of transistors in a predetermined manner to facilitate the input of external signals (e.g., a ground voltage, etc.) Specifically, the source strapping line is disposed on a semiconductor substrate in predetermined intervals. By disposing the source strapping in predetermined intervals, the number of contacts for source strapping are minimized. Furthermore, the predetermined interval based disposition of the source strapping also improves the degree of integration in a device.

FIG. 1A is a plan view of a conventional semiconductor device. FIG. 1B is a sectional view taken along line I-I' of FIG. 1A. Referring to FIGS. 1A and 1B, a device isolation layer is formed on a semiconductor substrate 10 to define a plurality of first active regions 14. In addition, source strapping active regions 16 are regularly disposed between the plurality of first active regions 14. The semiconductor device also includes a plurality of word lines 18. The plurality of word lines 18 cross over the tops of the first active regions 14 and the source strapping active regions 16. In addition, a drain region 20d is formed on an active region in one direction of each word line 18 and a source region 20s is formed on an active region in the other direction. Furthermore, a bit line contact 26d is connected to the drain region 20d. The source regions 20s formed in one direction of the word line 18 are electrically connected to the first active regions 14 and the second active regions 15 crossing over the source strapping active regions 16. Because the source regions 20s cross over the source strapping active regions 16, a source contact 26s is connected to the source strapping active regions 16 crossing over the second active regions 15.

As illustrated in FIGS. 1A and 1B, the word lines 18 of a conventional semiconductor device are bent in shape when passing on the source strapping active regions 16 to obtain an overlay margin of the source contact 26s and a bit line contact 26d. Additionally, the widths of the source strapping active regions 16 are formed to be wider than that of the first active regions 14. This increase in width is to minimize any influence that the source strapping active regions 16 may have on the cell transistor adjacent to source strapping active regions 16 in terms of affecting the characteristics of the semiconductor memory device.

A bit line 28 is formed to cross over the tops of the word lines 18 and be parallel to the first active regions 14. In addition, a source strapping line 30 is formed on the source strapping active regions 16 to cross over the tops of the word lines 18 and be parallel to the source strapping active regions 16. The bit line 28 is connected to the bit line contacts 26d there below, and the source strapping line 30 is connected to the source contacts 26s therebelow. In particular, the bit line 28 and the source strapping line 30 are formed on a first interlayer insulation layer 24 covering the word lines 18 and the bit line contact 26d. In addition, the source contacts 26s are formed through the first interlayer insulation layer 24.

In addition to word lines 18, the conventional semiconductor memory device also includes dummy word lines 18d. Specifically, dummy word lines 18d are disposed parallel to the word lines 18 in an outer perimeter of the word lines 18. The dummy word lines 18d are not used in an operation of a semiconductor device. Instead, the dummy word lines 18d are formed to prevent the word lines 18 from being inadvertently altered during the operation of the semiconductor device.

In a NOR non-volatile memory device, the source strapping line 30 is grounded. Accordingly, a ground line 40 is required to connect the source strapping line 30 to ground. In particular, the ground line 40 is electrically connected to a plurality of source strapping lines 30. Specifically, the source strapping lines 30 are covered with a second interlayer insulation layer 32. In addition, a strapping contact 34 is connected to the source strapping lines 30 through the second interlayer insulation layer 32. The ground line 40 is formed on the second interlayer insulation layer 32 to be electrically connected to the source strapping lines 30 through the strapping contact 34.

While the conventional semiconductor device includes a source strapping line to connect all the sources in the device, the conventional semiconductor device has many shortcomings. For example, as illustrated in FIGS. 1A and 1B, a conventional semiconductor device includes a source strapping active region 16 that is wider than other active regions so as to allow a source region to be grounded. However, a pitch change of the active regions due to a line width of the source strapping active region 16 may cause a change in the form of the first active regions 14 adjacent to the source strapping active region 16. In addition, the source strapping active region 16 may affect the normal operating characteristics of a cell transistor adjacent to the source strapping region 16.

In addition to the pitch change of the active region, a first wiring layer including the bit line 28 and the source strapping line 30 has an irregular pitch because of the source strapping line 30. The irregular pitch of the first wiring layer may inadvertently transform the bit line 28 that is adjacent to the source strapping line 30.

While the width of the source strapping active region 16 is formed with the minimum line width like another first active region 14, an interval between the source strapping active region 16 and the first active region 14 needs to be wider than an interval between the first active regions 14. By having a larger interval between the source strapping active region 16 and the first active region 14, changes to the characteristics of a cell transistor due to transformations in the word line 18 can be prevented. Similarly, even though the source strapping line 30 and the bit line 28 are formed with an identical line width, an interval between the bit line 28 and the source strapping line 30 needs to be wider than an interval between the bit lines 28. Additionally, when the source strapping line 30 is formed with the minimum line width like the bit line 28, an alignment margin of the strapping contact 34, which connects the source strapping line 30 and the ground line 40, needs to be maintained strictly.

The present disclosure is directed towards overcoming one or more of the problems associated with the conventional semiconductor devices.

SUMMARY OF THE INVENTION

One aspect of the present disclosure includes a semiconductor device. The semiconductor device includes a plurality of source regions and drain regions disposed on a semiconductor substrate. The semiconductor device also includes a plurality of word lines disposed on the semiconductor substrate between the source regions and the drain regions. The semiconductor device also includes a conductive line disposed on the semiconductor substrate parallel to the word lines. The semiconductor device also includes a plurality of bit lines connected to the drain regions and crossing over the word lines. The semiconductor device also includes a plurality of source strapping lines crossing over the plurality of word lines, the plurality of source strapping lines being connected to at least one of the plurality of source regions and the conductive line. The semiconductor device also includes a ground line connected to the conductive line.

Yet another aspect of the present disclosure includes a semiconductor device. The semiconductor device includes a plurality of active regions formed on a semiconductor substrate with a predetermined pitch. The semiconductor device also includes a plurality of source regions intersecting the active regions and being electrically connected to the active regions. The semiconductor device also includes a plurality of drain regions formed on the active regions between the source regions. The semiconductor device also includes a plurality of word lines crossing over the active regions and being disposed between the source regions and the drain regions. The semiconductor device also includes a conductive line disposed on an outer perimeter of a region in which the plurality of word lines are disposed in parallel to each other. The semiconductor device also includes a buried channel layer disposed on at least one of the plurality of active regions to intersect with the plurality of word lines and to electrically connect the plurality of source regions. The semiconductor device also includes source strapping lines crossing over the plurality of word lines and the conductive line, the source strapping lines electrically connecting the buried channel layer and the conductive line. The semiconductor device also includes a plurality of bit lines crossing over the word lines and connected to the plurality of drain regions.

BRIEF DESCRIPTION OF THE DRAWINGS

The accompanying drawings, which are included to provide a further understanding of the invention and are incorporated in and constitute a part of this application, illustrate exemplary embodiments of the invention and together with the description serve to explain the principle of the invention. In the drawings:

FIGS. 2A to 5A are plan views according to an exemplary embodiment of the present invention; and FIGS. 2B to 5B are sectional views of FIGS. 2A to 5A, respectively.

DETAILED DESCRIPTION OF EMBODIMENTS

Figure 1A:
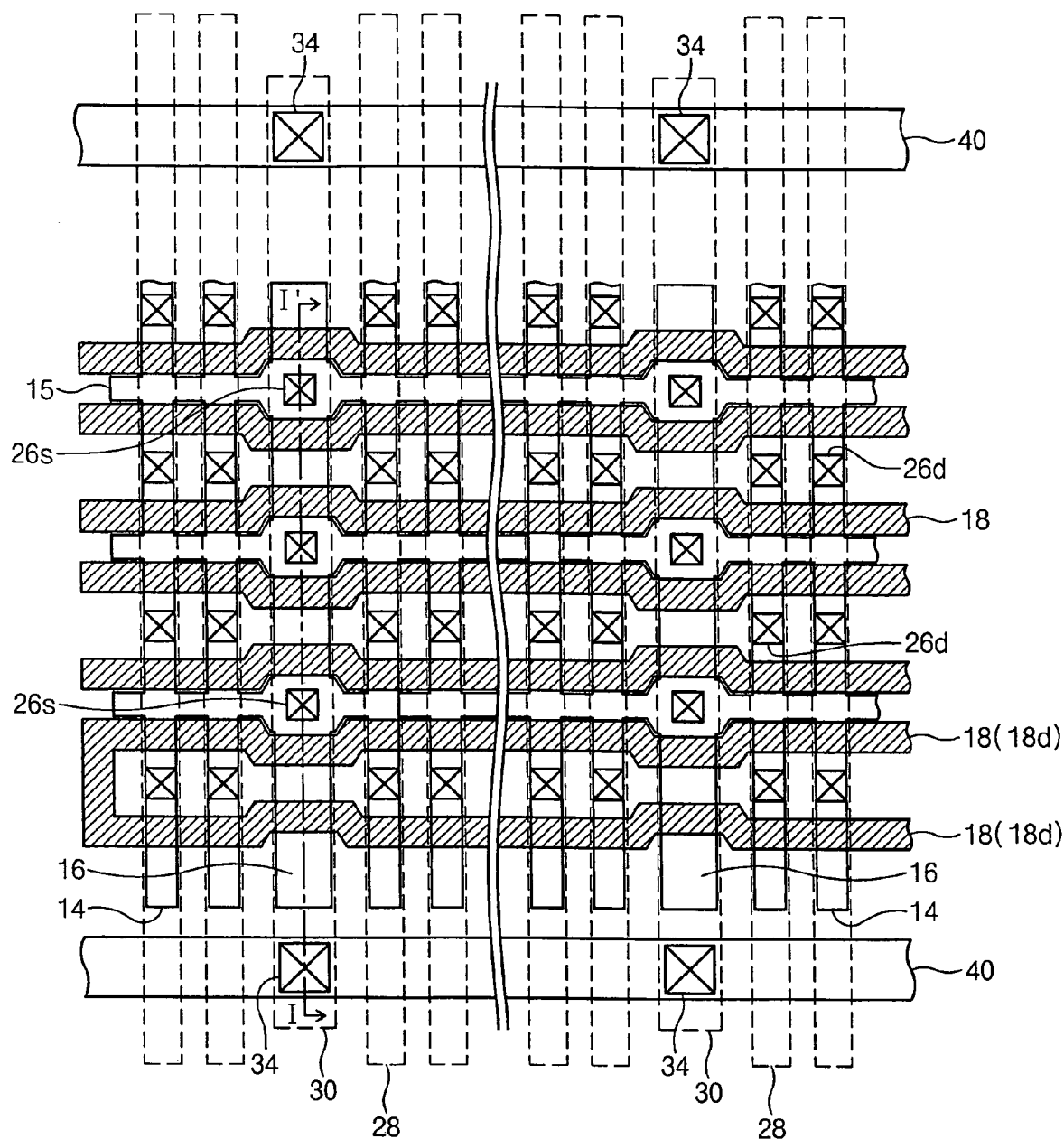
FIG. 1A is a plan view of a conventional semiconductor device.
Figure 1B:
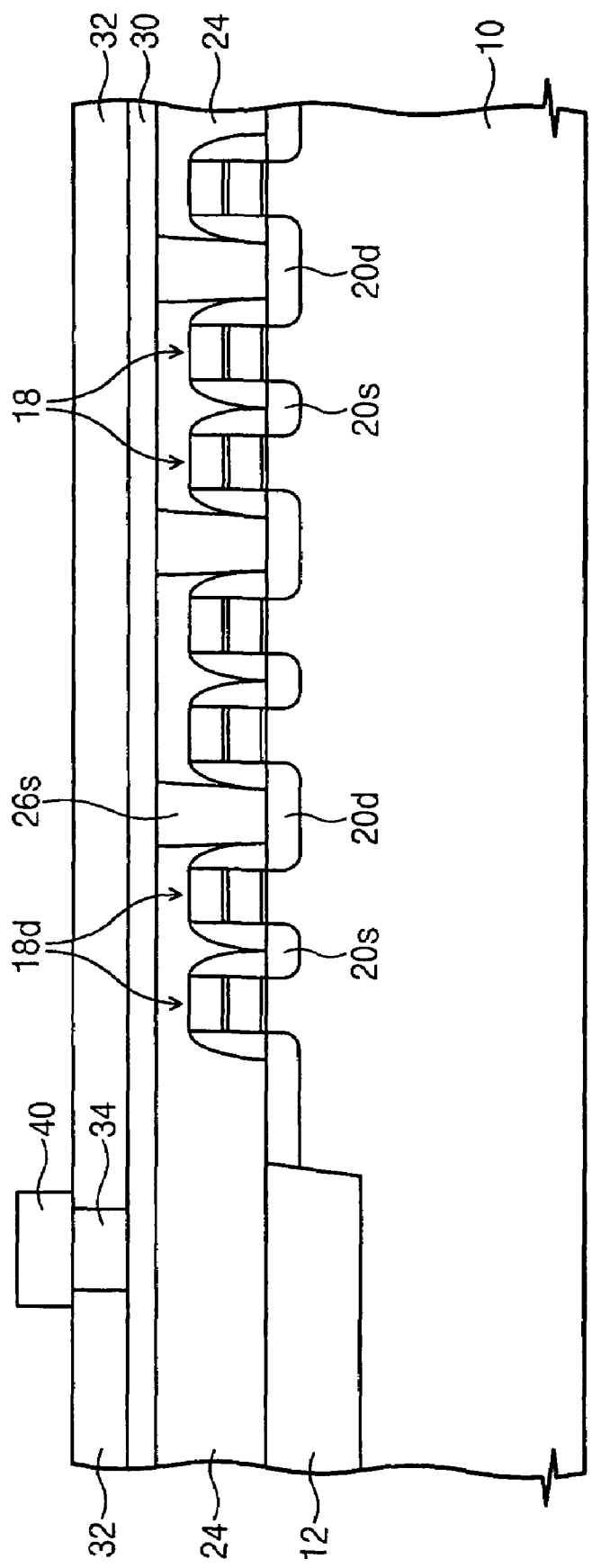
FIG. 1B is a sectional view taken along line I-I' of FIG. 1A.

Reference will now be made in detail to the exemplary embodiments of the present invention, examples of which are illustrated in the accompanying drawings. However, the present invention is not limited to the embodiments illustrated herein after, and the embodiments herein are rather introduced to provide easy and complete understanding of the scope and spirit of the present invention. In the drawings, the thicknesses of layers and regions are exaggerated for clarity. It will also be understood that when a layer is referred to as being "on" another layer or substrate, it can be directly on the other layer or substrate, or intervening layers may also be present. Like reference numerals in the drawings denote like elements, and thus their detailed description will be omitted for conciseness.

Figure 2A:
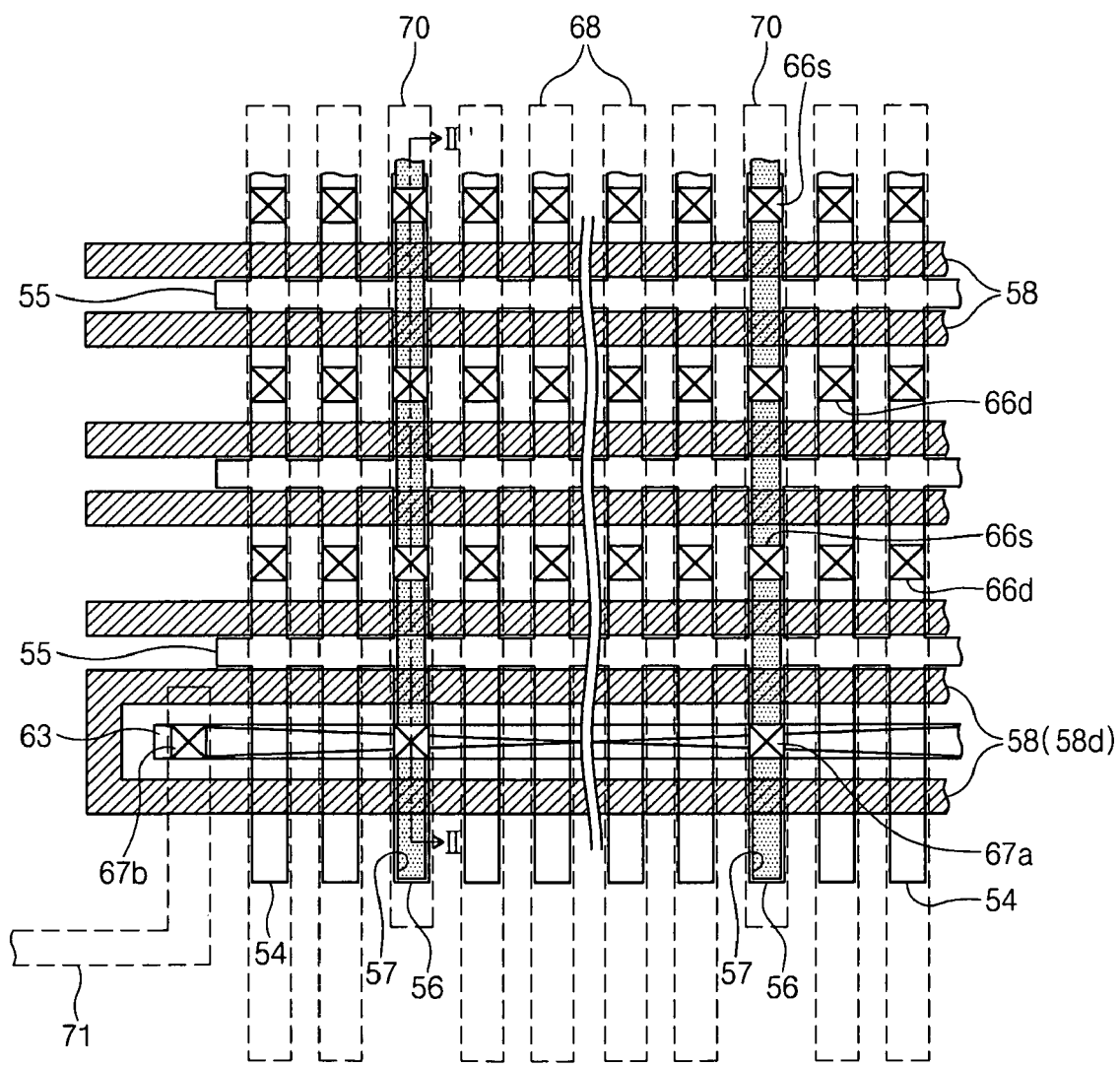
Figure 2B:
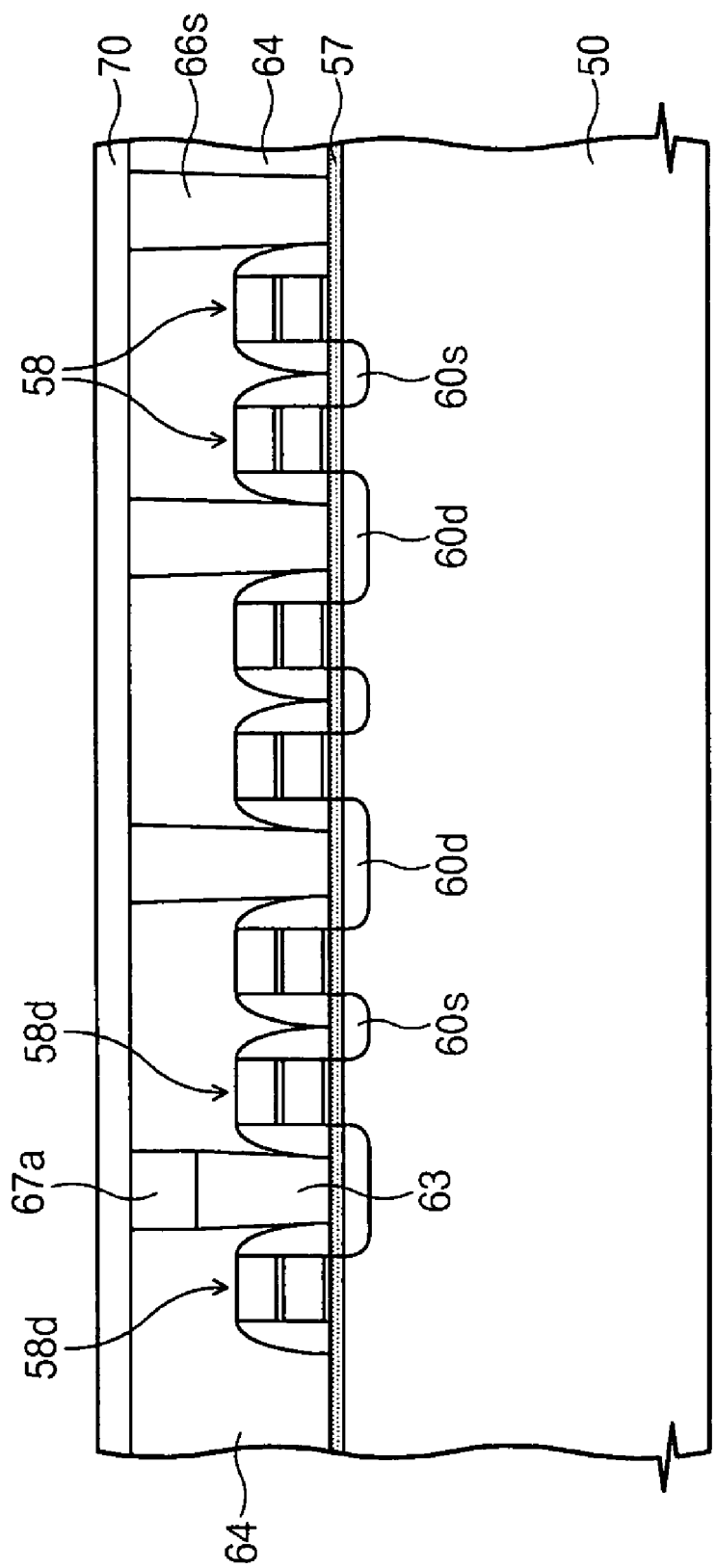

FIG. 2A is a plan view of a semiconductor device according to a first exemplary embodiment of the present invention. FIG. 2B is a sectional view taken along line II-II' of FIG. 2A;

Referring to FIGS. 2A and 2B, a plurality of parallel active regions 54 and 56 are formed on a semiconductor substrate 50 with a predetermined pitch. In addition, a second active region 55 is formed perpendicular to the active regions 54 and 56. These active regions include source strapping active regions 56 that are disposed between the first active regions 54 and are spaced a predetermined interval apart from the first active region 54. Because the active regions are formed with a predetermined pitch, a change in the characteristics of a cell transistor formed on an active region adjacent to a source strapping active region 56 is prevented. In addition to the plurality of active regions 54 and 56, a buried channel layer 57 is formed on the source strapping active regions 56. The properties of the buried channel layer 57 may be different than that of the semiconductor substrate 50. For example, the conductivity of the buried channel layer 57 that acts as an impurity diffusion layer may be different from that of the semiconductor substrate 50.

In an exemplary embodiment, a plurality of word lines 58 are disposed to cross over the tops of the active regions 54 and 56. In addition, dummy word lines 58d are also formed to prevent an inadvertent transformation of the word lines 58 due to light characteristics in an outer perimeter of the word lines 58. The dummy word lines 58d cross over the active regions 54 and 56 to be parallel to the word lines 58. In addition, the dummy word lines 58 can also be formed with more than three lines and can be connected to each other if necessary. The word lines 58 can include a reparative pair.

The semiconductor device also includes drain regions 60d and source regions 60s. In particular, the drain regions 60d can be formed on the first active regions 54 in one direction of each word line 58. Also, the source regions 60s can be formed on the first active regions 54 in the other direction of each word line 58. Furthermore, the source regions 60s are electrically connected along the second active region 55 that intersects the first active regions 54 and the source strapping active regions 56 and is also parallel to the word line 58. This configuration of the source regions 60s can form a common source line. Furthermore, the buried channel layer 57 is extended along the source strapping active region 56 to electrically connect a self-intersecting common source line (i.e., the source regions 60s).

The word lines 58 formed in one direction are formed with a first interval and the word lines 58 formed in the other direction are formed with a second interval. When a source region 60s is formed on an active region between the word lines 58 with the first interval and a drain region 60d is formed on an active region between the word lines 58 with the second interval, the first interval is narrower than the second interval. In this case, the first interval can be the minimum line width, and the second interval can be an alignment margin of the contact pattern and the word line plus the minimum line width.

In an exemplary embodiment, a conductive pattern 63 crossing over the tops of the first active regions 54 and the source strapping active regions 56 is formed on a semiconductor substrate between the dummy word lines 58d. In particular, the conductive pattern 63 is a conductor in a line shape disposed parallel to the word lines. Furthermore, the conductive pattern 63 can be formed in an interlayer insulation layer 64 that covers the semiconductor substrate 50 on which the source region 60s and the drain region 60d are formed.

In an exemplary embodiment, the semiconductor device also includes bit line contacts 66d and source contacts 66s. In particular, the bit line contacts 66*d* are formed through the interlayer insulation layer 64 to be connected to the drain regions 60*d*. Furthermore, the bit line contacts 66*d* are disposed parallel to the word line 58 in one direction of each word line 58. In addition, the source contacts 66*s* which are connected to the buried channel layer 57 with a predetermined interval between the bit line contacts 66*d* are formed through the interlayer insulation layer 64. Furthermore, a local strapping contact 67*a* and a global strapping contact 67*b* are formed on the conductive pattern 63 through the interlayer insulation layer 64.

The semiconductor device also includes bit lines 68 and source strapping lines 70. Furthermore, the bit lines 68 that are connected to the drain regions 60*d* and the source regions 60*s* are formed on the interlayer insulation layer 64 with a predetermined pitch. In particular, the bit lines 68 corresponding to the first active regions 54 are connected to the drain regions 60*d* through the bit line contacts 66*d* that are located below the bit lines 68. Similarly, the source strapping lines 70 corresponding to the source strapping active regions 56 are electrically connected to the source regions 60*s* through the source contacts 66*s* that are located below the source strapping lines 70. Furthermore, the bit lines 68 and the source strapping lines 70 are disposed on the interlayer insulation layer 64 with a predetermined pitch. Additionally, the bit line 68 and the source strapping line 70 have an identical line width.

The source strapping lines 70 are extended to a region on which the dummy word line 58*d* is formed and then intersect with the conductive pattern 63. In addition, the local strapping contact 67*a* is formed on the conductive pattern 63 intersecting with the source strapping lines 70. In particular, the source strapping line 70 and the conductive pattern 63 are connected through the local strapping contact 67*a*. On the other hand, the global strapping contact 67*b* can be formed on an end of the conductive pattern 63. Furthermore, a ground line 71 is formed on the interlayer insulation layer 64. The ground line 71 is also connected to the conductive pattern 63 through the global strapping contact 67*b*. Furthermore, a plurality of the source strapping lines 70 are electrically connected to the conductive pattern 63. Accordingly, the source regions 60*s* that are electrically connected to the source strapping lines 70 and the buried channel layer 57 are grounded through the ground line 71. When the source regions 60*s* are grounded, the ground line 71 can be a wiring pattern for an electric signal input when the conductive pattern 63 is connected to the ground line 71. However, an electric signal additional to a ground signal can also be input to the source regions 60*s* in a semiconductor device.

Figure 3A:
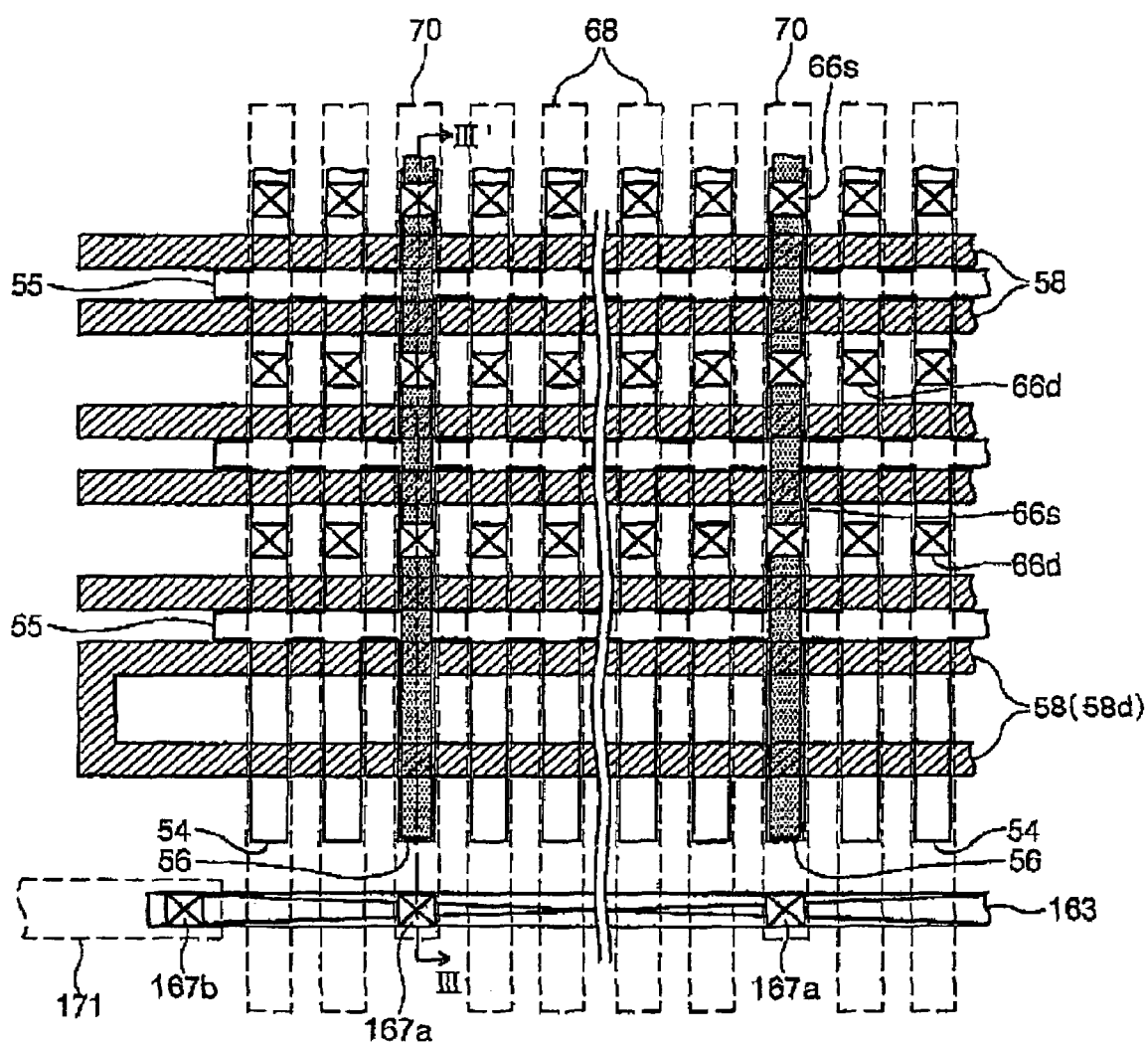
Figure 3B:
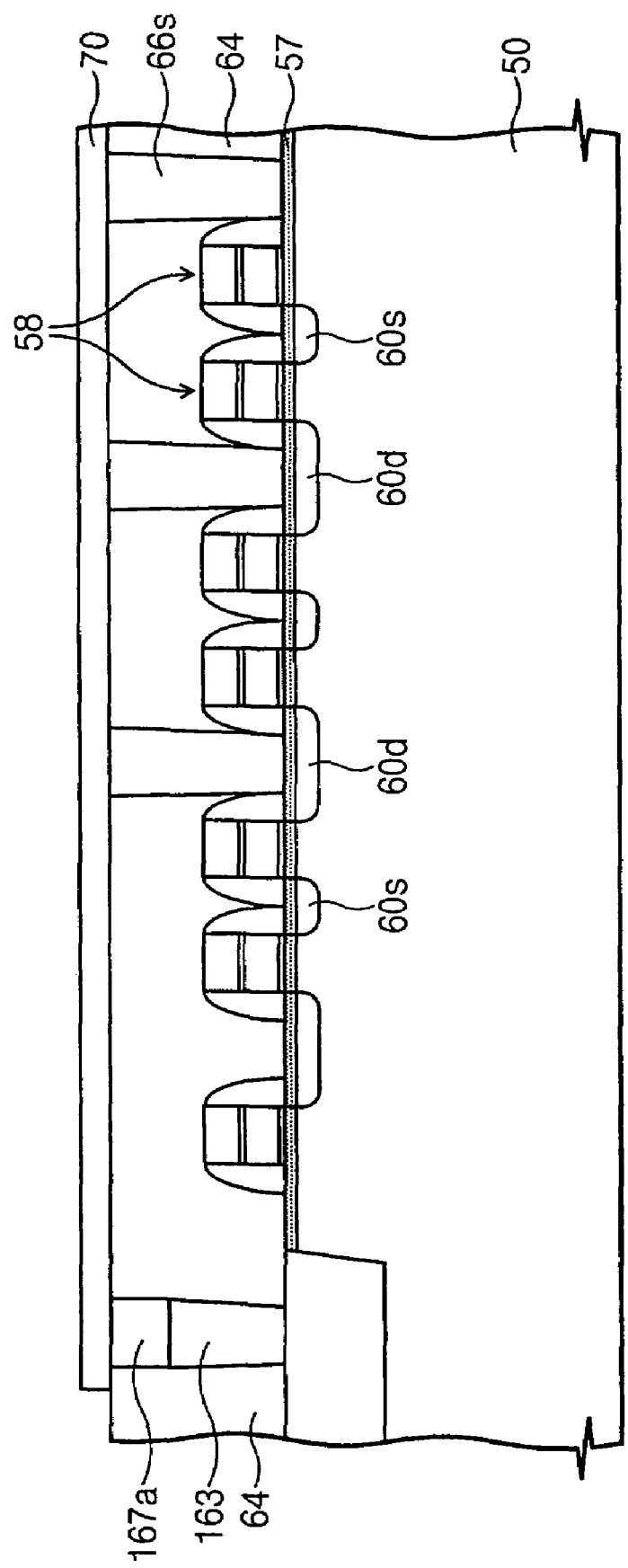

FIG. 3A is a plan view of a semiconductor device according to a second exemplary embodiment of the present invention. FIG. 3B is a sectional view taken along line III-III' of FIG. 3A;

Referring to FIGS. 3A and 3B, similar to the first embodiment, a plurality of parallel active regions 54 and 56 are formed on a semiconductor substrate 50 with a predetermined pitch. In addition, a second active region 55 is formed perpendicular to the active regions 54 and 56. Specifically, the active regions include source strapping active regions 56. The source strapping active regions 56 are disposed between the first active regions 54 and are spaced a predetermined interval apart from the first active region 54. Because the active regions are formed with a predetermined pitch, similar to conventional semiconductor devices, a change in the characteristics of a cell transistor formed on an active region adjacent to a source strapping active region may be prevented. A buried channel layer 57 is formed on the source strapping active regions 56. Again, similar to the first exemplary embodiment, the properties of the buried channel layer 57 may be different than that of the semiconductor substrate 50. For example, the conductivity of the buried channel layer 57 that acts as an impurity diffusion layer may be different from that of the semiconductor substrate 50.

The semiconductor device also includes a plurality of word lines 58 and a plurality of dummy word lines 58*d*. In particular, the plurality of word lines 58 are configured to cross over the tops of the active regions 54 and 56. The dummy word lines 58*d* may have various uses. For example, the dummy word lines 58*d* are formed to prevent a transformation of the word line due to light effects in an outer perimeter of the word lines 58. In an exemplary embodiment, the dummy word lines 58*d* cross over the active regions 54 and 56 to be parallel to the word lines 58. Furthermore, the dummy word lines 58*d* can also be formed with more than three lines and connected to each other if necessary. Furthermore, the word lines 58 can include a reparative pair.

The semiconductor device also includes drain regions 60*d* and source regions 60*s*. In particular, the drain regions 60*d* can be formed on the first active regions 54 in one direction of each word line 5. Also, source regions 60*s* can be formed on the first active regions 54 in the other direction of each word line 58. Furthermore, the source regions 60*s* are electrically connected along the second active region 55 that intersects the first active regions 54 and the source strapping active regions 56 and is also parallel to the word line 58. This configuration of the source regions 60*s* can form a common source line. Furthermore, the buried channel layer 57 is extended along the source strapping active region 56 to electrically connect a self-intersecting common source line (i.e., the source regions 60*s*).

The word lines 58 formed in one direction are formed with a first interval and the word lines 58 in the other direction are formed with a second interval. When a source region 60*s* is formed on an active region between the word lines 58 with the first interval and a drain region 60*d* is formed on an active region between the word lines 58 with the second interval, the first interval is narrower than the second interval. In this case, the first interval can be the minimum line width, and the second interval can be an alignment margin of the contact pattern and the word line plus the minimum line width.

In an exemplary embodiment, a conductive pattern 163 that is parallel to the word line 58 is formed on an outer perimeter of the dummy word lines 58*d*. The conductive pattern may be formed in many ways. Specifically, the conductive pattern 163 can be formed in an interlayer insulation layer 64 covering the semiconductor substrate 50 on which the word lines 58 and 58*d*, the source region 60*s*, and the drain region 60*d* are formed.

In an exemplary embodiment, the semiconductor device also includes bit line contacts 66*d* and source contacts 66*s*. Specifically, the bit line contacts 66*d* are formed through the interlayer insulation layer 64 to be connected to the drain regions 60*d*. Furthermore, the bit line contacts 66*d* are disposed parallel to the word line 58 in one direction of each word line 58. In addition, the source contacts 66*s* which are connected to the buried channel layer 57 with a predetermined interval between the bit line contacts 66*d* are formed through the interlayer insulation layer 64. Furthermore, a local strapping contact 167*a* and a global strapping contact 167*b* are formed on the conductive pattern 163 through the interlayer insulation layer 64.

The semiconductor device also includes bit lines 68 and source strapping lines 70. Furthermore, the bit lines 68 that are connected to the drain regions 60*d* and the source regions 60s are formed on the interlayer insulation layer 64 with a predetermined pitch. In particular, the bit lines 68 corresponding to the first active regions 14 are connected to the drain regions 60d through the bit line contacts 66d that are located below the bit lines 68. Similarly, the source strapping lines 70 corresponding to the source strapping active regions 56 are electrically connected to the source regions 60s through the source contacts 66s that are below the source strapping lines 70. Furthermore, the bit lines 68 and the source strapping lines 70 are disposed on the interlayer insulation layer 64 with a predetermined pitch. Additionally, the bit line 68 and the source strapping line 70 have an identical line width.

The source strapping lines 70 are extended to a region on which the dummy word line 58d is formed and intersect with the conductive pattern 163. In addition, the local strapping contact 167a is formed on the conductive pattern 163 intersecting with the source strapping lines 70. In particular, the source strapping line 70 and the conductive pattern 163 are connected through the local strapping contact 167a. On the other hand, the global strapping contact 167b can be formed on an end of the conductive pattern 163. Furthermore, a ground line 171 is formed on the interlayer insulation layer 64. The ground line 71 is also connected to the conductive pattern 163 through the global strapping contact 167b. Furthermore, a plurality of source strapping lines 70 are electrically connected to the conductive pattern 163. Accordingly, the source regions 60s that are electrically connected to the source strapping lines 70 and the buried channel layer 57 are grounded through the ground line 171. When the source regions 60s are grounded, the ground line 171 can be a wiring pattern for an electric signal input when the conductive pattern 163 is connected to the ground line 171. However, an electric signal additional to a ground signal can also be input to the source regions 60s in a semiconductor device.

Figure 4A:
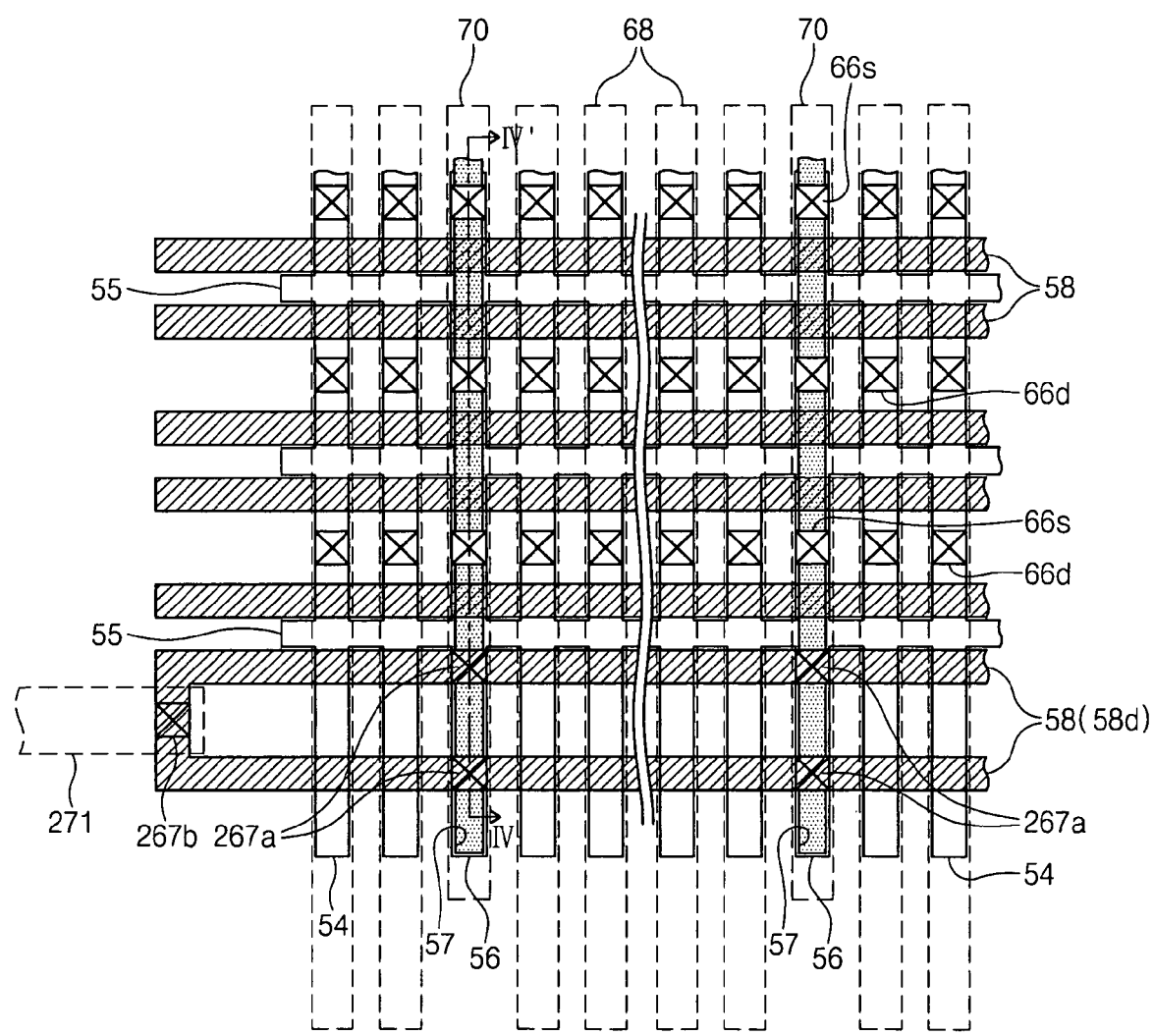
Figure 4B:
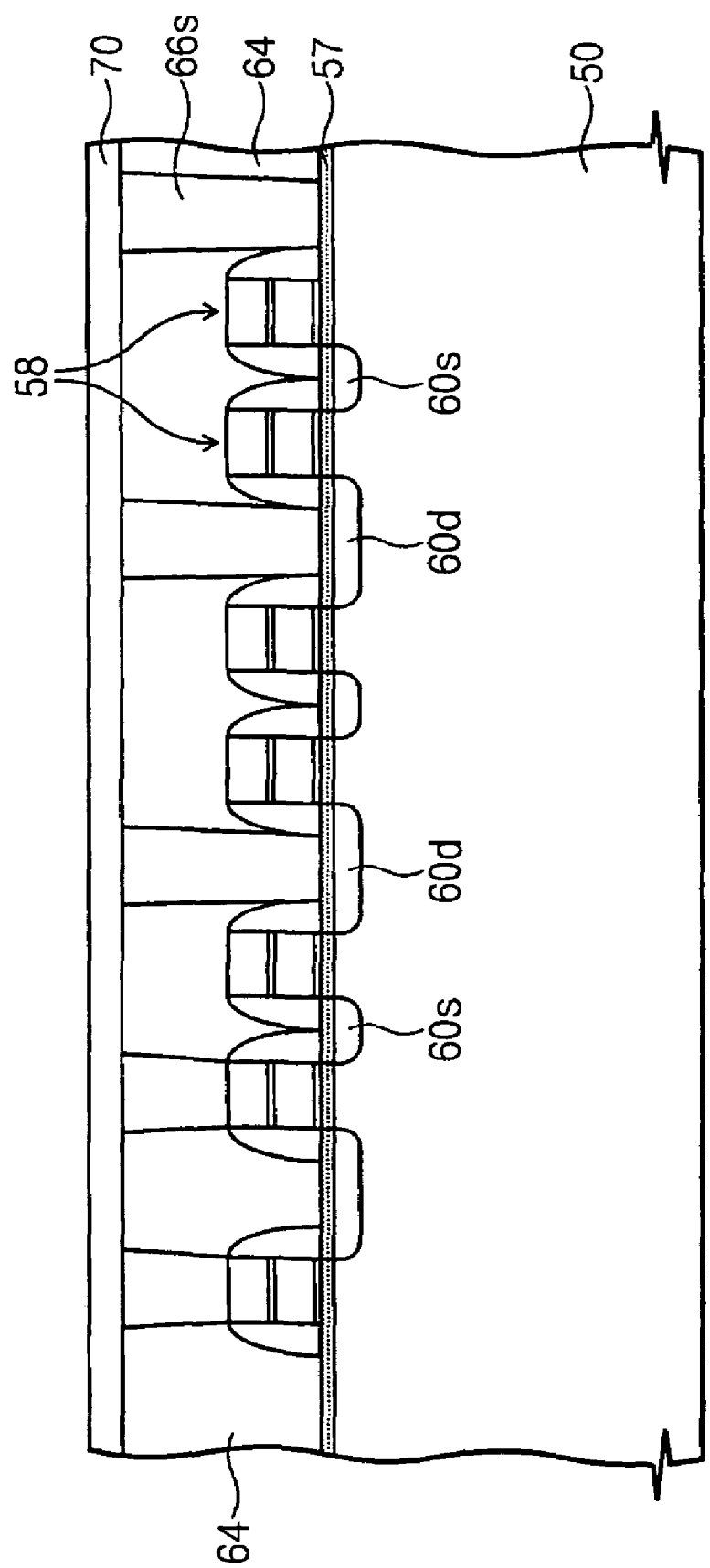

FIG. 4A is a plan view of a semiconductor device according to a third embodiment of the present invention. FIG. 4B is a sectional view taken along line IV-IV' of FIG. 4A;

Referring to FIGS. 4A and 4B, similar to the first embodiment, a plurality of parallel active regions 54 and 56 are formed on a semiconductor substrate 50 with a predetermined pitch. In addition, a second active region 55 is formed perpendicular to the active regions 54 and 56. Specifically, the active regions include source strapping active regions 56. The source strapping active regions 56 are disposed between the first active regions 54 and are spaced a predetermined interval apart from the first active region 54. Because the active regions are formed with a predetermined pitch, similar to conventional semiconductor devices, a change in the characteristics of a cell transistor formed on an active region adjacent to a source strapping active region may be prevented. A buried channel layer 57 is formed on the source strapping active regions 56. Again, similar to the first exemplary embodiment, the properties of the buried channel layer 57 may be different than that of the semiconductor substrate 50. For example, the conductivity of the buried channel layer 57 that acts as an impurity diffusion layer may be different from that of the semiconductor substrate 50.

The semiconductor device also includes a plurality of word lines 58 and a plurality of dummy word lines 58d. In particular, the plurality of word lines 58 are configured to cross over the tops of the active regions 54 and 56. In addition, the word lines 58 can include a reparative pair.

The semiconductor device also includes drain regions 60d and source regions 60s. In particular, the drain regions 60d can be respectively formed on the first active regions 54 in one direction of each word line 58. Also, source regions 60s can be formed on the first active regions 54 in the other direction of each word line 58. Furthermore, the source regions 60s are electrically connected along the second active region 55 that intersects the first active regions 54 and the source strapping active regions 56 and is also parallel to the word line 58. This configuration of the source regions 60s can form a common source line. Furthermore, the buried channel layer 57 is extended along the source strapping active region 56 to electrically connect a self-intersecting common source line (i.e., the source regions 60s).

The word lines 58 formed in one direction are formed with a first interval and the word lines 58 in the other direction are formed with a second interval. When a source region 60s is formed on an active region between the word lines 58 with the first interval and a drain region 60d is formed on an active region between the word lines 58 with the second interval, the first interval is narrower than the second interval. In this case, the first interval can be the minimum line width and the second interval can be an alignment margin of the contact pattern and the word line plus the minimum line width.

The semiconductor device also includes a plurality of dummy word lines 58d. The dummy word lines 58d may have various uses. For example, the dummy word lines 58d are formed on an outer perimeter of the word lines 58 to prevent a transformation of the word lines 58 due to the effects of light. In an exemplary embodiment, the dummy word lines 58d are parallel to the word lines 58 and cross over tops of the active regions 54 and 56, and can be formed with more than three lines and connected to each other if necessary. In the third exemplary embodiment, at least one of the dummy word lines 58d corresponds to the conductive pattern 63 of FIGS. 2A and 2B that electrically connects a source strapping line 70 and a ground line 271.

The semiconductor device also includes bit line contacts 66d and source contacts 66s. In particular, the bit line contacts 66d are formed through the interlayer insulation layer 64 to be connected to their corresponding drain regions 60d. In addition, the bit line contacts 66d are disposed parallel to the word line 58 in one direction of each word line 58. Similarly, source contacts 66s that are connected to the buried channel layer 57 with a predetermined interval between the bit line contacts 66d are formed through the interlayer insulation layer 64. In addition, a local strapping contact 267a and a global strapping contact 267b are formed on the dummy ground lines 58d through the interlayer insulation layer 64.

In addition to source strapping lines 70, the semiconductor device also includes bit lines 68. Furthermore, the bit lines 68 that are connected to the drain regions 60d and the source regions 60s are formed on the interlayer insulation layer 64 with a predetermined pitch. In particular, the bit lines 68 corresponding to the first active regions 54 are connected to the drain regions 60d through the bit line contacts 66d that are located below the bit lines 68. Similarly, the source strapping lines 70 corresponding to the source strapping active regions 56 are electrically connected to the source regions 60s through the source contacts 66s that are located below the source strapping lines 70. Furthermore, the bit lines 68 and the source strapping lines 70 are disposed on the interlayer insulation layer 64 with a predetermined pitch. Additionally, the bit line 68 and the source strapping line 70 have an identical line width.

The source strapping lines 70 are extended to a region on which the dummy word line 58d is formed, and intersect with at least one of the dummy word lines 58d. Furthermore, the local strapping contact 267a is formed on the dummy word line 58d that intersects with the source strapping lines 70. In particular, at least one of the source strapping lines 70 and the dummy word line 58d is connected through the local strapping contact 267a. In addition, the global strapping contact 267b can be formed on an end of the dummy word line 58d. In particular, the global strapping contact 267b can be formed on ends of the dummy word line 58d to which the local strapping contact 267a is connected.

The semiconductor device also includes a ground line 271. Specifically, the ground line 271 is formed on the interlayer insulation layer 64 and is connected to the dummy word line 58d through the global strapping contact 267b. In an exemplary embodiment, the dummy word line to which the ground line 271 is connected includes the local strapping contact 267a. In addition, a plurality of source strapping lines 70 are electrically connected to the dummy word line 58d that is connected to the ground line 271. Accordingly, the source regions 60s that are electrically connected to the source strapping lines 70 and the buried channel layer 57 are grounded through the ground line 271. In an exemplary embodiment, in which the source regions are grounded, the ground line 271 can be a wiring pattern for an electric signal that is input when the dummy word line 58d is connected to the ground line 271. However, an electric signal additional to a ground signal can also be inputted to the source regions in a semiconductor device.

As described above, in the third exemplary embodiment, unlike the first exemplary embodiment, the additional conductive pattern 63 of FIGS. 2A and 2B is not required. Instead, an electric signal can be delivered to the source regions 60s through the dummy word line 58d to prevent a word line transformation due to the effects of light.

Figure 5A:
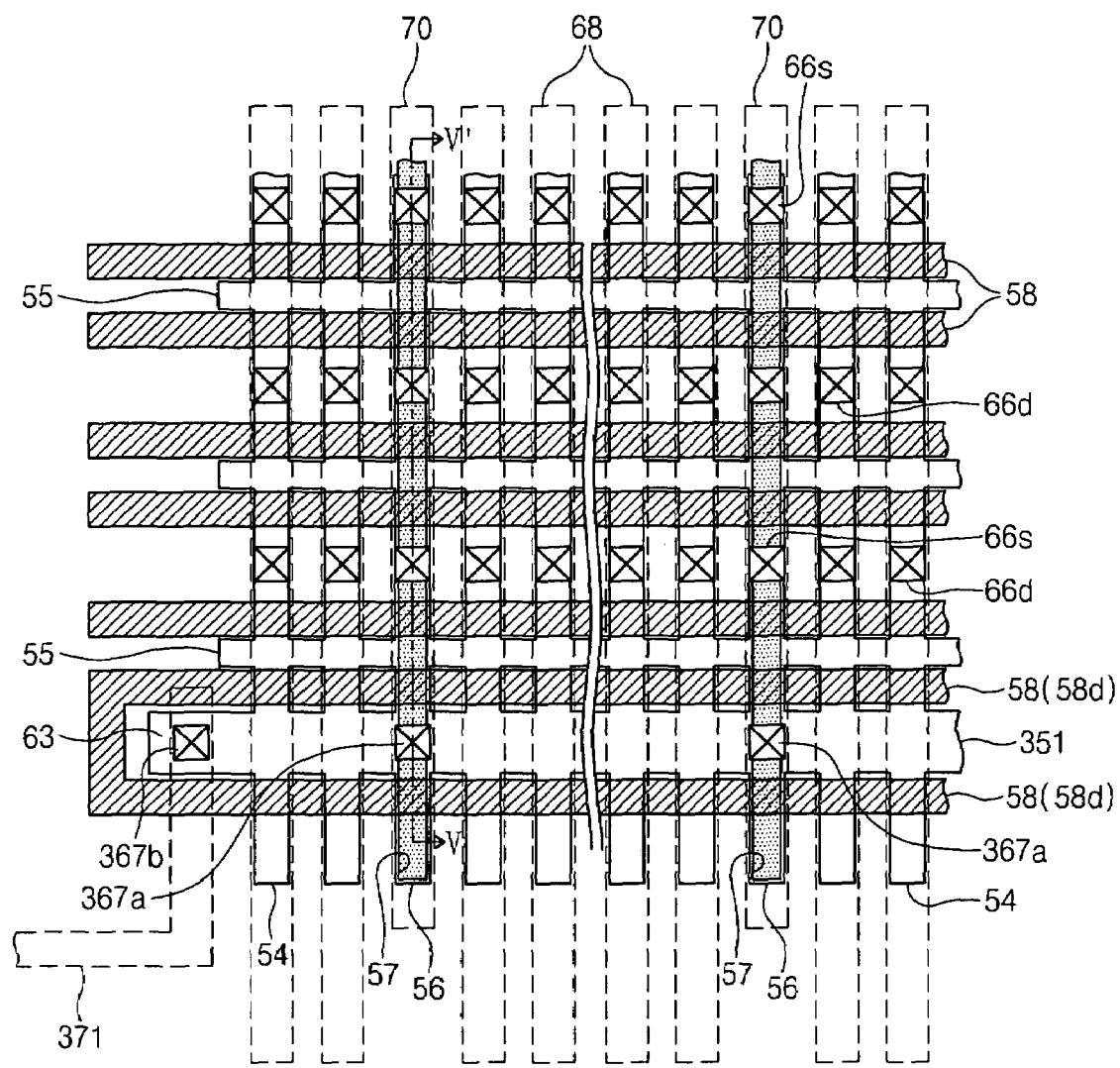

FIG. 5A is a plan view of a semiconductor device according to a fourth exemplary embodiment of the present invention. FIG. 5B is a sectional view taken along line V-V' of FIG. 5A.

Referring to FIGS. 5A and 5B, like the first embodiment, a plurality of parallel active regions 54 and 56 are formed on a semiconductor substrate 50 in a predetermined pitch. In addition, a second active region 55 is formed perpendicular to the active regions 54 and 56. These active regions include source strapping active regions 56 that are disposed between the first active regions 54 and spaced a predetermined interval apart from the first active region 54. Because the active regions are formed with a predetermined pitch, similar to the conventional semiconductor devices, a change in the characteristics of a cell transistor formed on an active region adjacent to a source strapping active region 56 is prevented. In addition to the plurality of active regions 54 and 56, a buried channel layer 57 is formed on the source strapping active regions 56. The properties of the buried channel layer 57 may be different than that of the semiconductor substrate 50. For example, the conductivity of the buried channel layer 57 that acts as an impurity diffusion layer, may be different from that of the semiconductor substrate 50.

In an exemplary embodiment, a plurality of word lines 58 are disposed to cross over the tops of the active regions 54 and 56. In addition, dummy word lines 58d are also formed to prevent an inadvertent transformation of the word lines 58 due to light characteristics in an outer perimeter of the word lines 58. The dummy word lines 58d cross over the active regions 54 and 56 to be parallel to the word lines 58. In addition, the dummy word lines 58 can also be formed with more than three lines and can be connected to each other if necessary. The word lines 58 can include a reparative pair.

The semiconductor device also includes drain regions 60d and source regions 60s. In particular, the drain regions 60d can be formed on the first active regions 54 in one direction of each word line 58. Also, the source regions 60s can be formed on the first active regions 54 in the other direction of each word line 58. Furthermore, the source regions 60s are electrically connected along the second active region 55 that intersects the first active regions 54 and the source strapping active regions 56 and is also parallel to the word line 58. This configuration of the source regions 60s can form a common source line. Furthermore, the buried channel layer 57 is extended along the source strapping active region 56 to electrically connect a self-intersecting common source line (i.e., the source regions 60s).

The word lines 58 formed in one direction are formed with a first interval and the word lines 58 formed in the other direction are formed with a second interval. When a source region 60s is formed on an active region between the word lines 58 with the first interval and a drain region 60d is formed on an active region between the word lines 58 with the second interval, the first interval is narrower than the second interval. In this case, the first interval can be the minimum line width, and the second interval can be an alignment margin of the contact pattern and the word line plus the minimum line width.

In an exemplary embodiment, a third active region 351 intersecting the first active regions 54 and the source strapping active regions 56 is formed between the dummy word lines 58d or on a semiconductor substrate adjacent to the dummy word lines 58d. In addition, a conductive diffusion layer 360 that is parallel to the word line 58 is formed by injecting impurity on the third active region 351.

In an exemplary embodiment, the semiconductor device also includes bit line contacts 66d and source contacts 66s. In particular, the bit line contacts 66d are formed through the interlayer insulation layer 64 to be respectively connected to the drain regions 60d. Furthermore, the bit line contacts 66d are disposed parallel to the word line 58 in one direction of each word line 58. In addition, the source contacts 66s which are connected to the buried channel layer 57 with a predetermined interval between the bit line contacts 66d, are formed through the interlayer insulation layer 64. Furthermore, a local strapping contact 367a and a global strapping contact 367b are formed on the third active region through the interlayer insulation layer 64.

The semiconductor device also includes bit lines 68 and source strapping lines 70. Furthermore, the bit lines 68 that are connected to the drain regions 60d and the source strapping lines 70 that are electrically connected to the source regions 60s are formed on the interlayer insulation layer 64 with a predetermined pitch. In particular, the bit lines 68 corresponding to the first active regions 54 are connected to the drain regions 60d through the bit line contact 66d that are located below the bit lines 68. Similarly, the source strapping lines 70 corresponding to the source strapping active regions 56 are electrically connected to the source regions 60s through the source contacts 66s that are located below the source strapping lines 70. Furthermore, the bit lines 68 and the source strapping lines 70 are disposed on the interlayer insulation layer 64 with a predetermined pitch. Additionally, the bit line 68 and the source strapping line 70 have an identical line width.

The source strapping lines 70 are extended to a region on which the dummy word line 58d is formed and intersect with the conductive diffusion layer 360. In addition, the local strapping contact 367a is formed on the conductive diffusion layer 360 that intersects with the source strapping lines 70. Specifically, the source strapping line 70 and the conductive diffusion layer 360 are connected through the local strapping contact 367a. Furthermore, the global strapping contact 367b can be formed on ends of the conductive diffusion layer 360.

The semiconductor device also includes a ground layer 371. In particular, the ground line 371 is formed on the interlayer insulation layer 64 to be connected to the conductive diffusion layer 360 through the global strapping contact 367b. In addition, a plurality of source strapping lines 70 are electrically connected to the conductive diffusion layer 360. Accordingly, the source regions 60s that are electrically connected to the source strapping lines 70 and the buried channel layer 57 are grounded through the ground line 371.

In addition, the buried channel layer 57 is extended to the third active region 351 to be electrically connected to the conductive diffusion layer 360. The resistance of the conductive diffusion layer 360 is relatively higher than a conductive line connected to the source strapping lines 70 in the first embodiment. The effect of this high resistance of the conductive diffusion layer 360 can be compensated to some degree by connecting the source strapping line 70 and the buried channel layer 57 to the conductive diffusion layer 360. Additionally, when a silicide layer is formed on the first active region 54, the second active region 55, a source strapping active region 56, and the third active region 351 of both sides of the word lines 58 and the dummy word lines 58d by applying a silicide process, the third active region 351 can have a conductivity identical or similar to the conductive line in the first embodiment. This is because a resistance of the third active region 351 becomes lower. In an exemplary embodiment in which the source regions 60s are grounded, the ground line 371 can be a wiring pattern for an electric signal input when the conductive diffusion layer 360 is connected to the ground line 371. However, an electric signal additional to a ground signal can also be inputted to the source regions 60s in a semiconductor device.

The semiconductor device described in the exemplary embodiments above can be used in any component including semiconductor devices. As described above, a transformation of an active region adjacent to the source strapping active region can be prevented by forming active regions with a predetermined pitch. Furthermore, it is unnecessary to bend the word line by disposing the source contact and the bit line contact on an identical line. Therefore, an inadvertent change in the characteristics of a cell transistor adjacent to the source strapping active region can be prevented.

Moreover, the source strapping lines and the bit lines can be formed with a predetermined pitch. In addition, the source strapping line is connected to the ground line through the conductive line formed below the source strapping line. Therefore, it is not necessary to control a wiring formation margin of the strapping contacts with as much precision as those of the bit line and the source strapping line.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A semiconductor device comprising:
   a plurality of source regions and drain regions disposed on a semiconductor substrate;
   a plurality of word lines disposed on the semiconductor substrate between the source regions and the drain regions;
   a conductive line disposed on the semiconductor substrate parallel to the word lines;
   a plurality of bit lines connected to the drain regions and crossing over the word lines;
   a plurality of source strapping lines crossing over the plurality of word lines, the plurality of source strapping lines being connected to at least one of the plurality of source regions and the conductive line; and
   a ground line connected to the conductive line,
   wherein the conductive line is a dummy word line disposed on an outer perimeter of a region in which the plurality of word lines are disposed.

2. The semiconductor device of claim 1, wherein the plurality of bit lines and the plurality of source strapping lines are disposed with a predetermined pitch.

3. The semiconductor device of claim 2, wherein a width of at least one of the plurality of bit lines is identical to a width of at least one of the plurality of the source strapping lines.

4. The semiconductor device of claim 1, further comprising:
   bit line contacts electrically connected to at least one of the plurality of drain regions and at least one of the plurality of bit lines; and
   source contacts electrically connected to at least one of the plurality of source regions and at least one of the plurality of source strapping lines,
   wherein the source contacts and the bit line contacts are disposed in parallel to and between adjacent word lines.

5. The semiconductor device of claim 4, further comprising an impurity diffusion layer disposed on the semiconductor substrate under the plurality of word lines, and in parallel to the plurality of source strapping lines and electrically connected to the plurality of source regions,
   wherein at least one of the source contacts is formed on the impurity diffusion layer.

6. The semiconductor device of claim 1, further comprising a conductive pattern intersecting with the plurality of source strapping lines.

7. The semiconductor device of claim 1, further comprising a conductive diffusion layer intersecting with the plurality of source strapping lines.

8. The semiconductor device of claim 1, further comprising:
   a plurality of first active regions intersecting the plurality of word lines; and
   a plurality of second active regions connected to the plurality of first active regions and intersecting the plurality of first active regions;
   wherein at least one of the plurality of source regions is disposed on at least one of the plurality of second active regions to be parallel to the plurality of word lines and at least one of the plurality of drain regions is disposed on at least one of the plurality of first active regions between the plurality of word lines.

9. The semiconductor device of claim 8, further comprising:
   a source strapping active region located under at least one of the plurality of source strapping lines and formed on the semiconductor substrate, the source strapping active region being disposed between the plurality of first active regions to intersect the second active regions; and
   an impurity diffusion layer formed on the source strapping active region to electrically connect the plurality of source regions formed on the second active regions.

10. The semiconductor device of claim 8, wherein the plurality of first active regions are disposed with an identical pitch.

11. A semiconductor device comprising:
    a plurality of active regions formed on a semiconductor substrate with a predetermined pitch;

a plurality of source regions intersecting the active regions and being electrically connected to the active regions;

a plurality of drain regions formed on the active regions between the source regions;

a plurality of word lines crossing over the active regions and being disposed between the source regions and the drain regions;

a conductive line disposed on an outer perimeter of a region in which the plurality of word lines are disposed in parallel to each other;

an impurity diffusion layer disposed on at least one of the plurality of active regions to intersect with the plurality of word lines and to electrically connect the plurality of source regions;

source strapping lines crossing over the plurality of word lines and the conductive line, the source strapping lines electrically connecting the impurity diffusion layer and the conductive line;

a plurality of bit lines crossing over the word lines and connected to the plurality of drain regions; and a plurality of dummy word lines disposed on an outer perimeter of the region in which the plurality of word lines are disposed, the plurality of dummy word lines crossing over the plurality of active regions in parallel to the plurality of word lines, wherein the conductive line is a conductive pattern disposed between the plurality of dummy word lines.

12. The semiconductor device of claim 11, further comprising:
bit line contacts connected to the plurality of drain regions disposed beside a sidewall of each of the word lines;
a source contact arranged below the source strapping lines, the source contact being connected to the impurity diffusion layer.

13. The semiconductor device of claim 11, wherein the width of at least one of the source strapping lines is identical with that of at least one of the plurality of bit lines.

14. The semiconductor device of claim 13, wherein the source strapping lines and the plurality of bit lines are disposed with a predetermined pitch.

15. The semiconductor device of claim 11,
wherein the plurality of dummy word lines are disposed between the conductive line and the plurality of word lines.

16. The semiconductor device of claim 11, wherein the conductive line is disposed parallel to the plurality of word lines and is electrically connected to the impurity diffusion layer.

* * * * *